US010655956B2

(12) United States Patent
Ogawa et al.

(10) Patent No.: US 10,655,956 B2
(45) Date of Patent: May 19, 2020

(54) DISPLACEMENT MEASURING APPARATUS, ELECTRON BEAM INSPECTION APPARATUS, AND DISPLACEMENT MEASURING METHOD

(71) Applicant: NuFlare Technology, Inc., Yokohama-shi (JP)

(72) Inventors: Riki Ogawa, Kawasaki (JP); Hiroyuki Nagahama, Niiza (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/222,270

(22) Filed: Dec. 17, 2018

(65) Prior Publication Data

US 2019/0195621 A1 Jun. 27, 2019

(30) Foreign Application Priority Data

Dec. 21, 2017 (JP) .................................. 2017-244772

(51) Int. Cl.
*G01B 11/25* (2006.01)
*H01J 37/22* (2006.01)
(Continued)

(52) U.S. Cl.
CPC .............. *G01B 11/25* (2013.01); *H01J 37/20* (2013.01); *H01J 37/21* (2013.01); *H01J 37/222* (2013.01);
(Continued)

(58) Field of Classification Search
CPC . G01B 11/25; H01J 37/21; H01J 37/20; H01J 37/28; H01J 37/226; H01J 37/222; H01J 2237/20235; H01J 2237/2448; H01J 2237/216
USPC ................................ 250/306, 307, 310, 311
See application file for complete search history.

(56) References Cited

U.S. PATENT DOCUMENTS 5,125,741 A * 6/1992 Okada ................ G01N 21/8901
356/237.2
5,298,976 A * 3/1994 Shahar ................ G01B 11/026
250/559.31
(Continued)

FOREIGN PATENT DOCUMENTS

JP 11-149895 6/1999
JP 11149895 A * 6/1999
JP 2011-155119 8/2011

OTHER PUBLICATIONS

Combined Taiwanese Office Action and Search Report dated Aug. 6, 2019 in Patent Application No. 107142049 (with unedited computer generated English translation ), 13 pages.
(Continued)

*Primary Examiner* — Michael Maskell
(74) *Attorney, Agent, or Firm* — Oblon, McClelland, Maier & Neustadt, L.L.P.

(57) ABSTRACT

A displacement measuring apparatus includes an illumination system to obliquely irradiate the target object surface with beams, a sensor to receive a reflected light from the target object surface, an optical system to diverge the reflected light in a Fourier plane with respect to the target object surface, a camera to image a diverged beam in the Fourier plane, a gravity center shift amount calculation circuitry to calculate a gravity center shift amount of the reflected light in the light receiving surface of the sensor, based on a light quantity distribution of the beam imaged by the camera, and a measurement circuitry to measure a heightwise displacement of the target object surface by an optical lever method, using information on a corrected gravity center position obtained by correcting the gravity center position of the reflected light received by the sensor by using the gravity center shift amount.

9 Claims, 10 Drawing Sheets

(51) Int. Cl.
*H01J 37/28* (2006.01)
*H01J 37/20* (2006.01)
*H01J 37/21* (2006.01)

(52) U.S. Cl.
CPC ............ *H01J 37/226* (2013.01); *H01J 37/28* (2013.01); *H01J 2237/20235* (2013.01); *H01J 2237/216* (2013.01); *H01J 2237/2448* (2013.01)

(56) References Cited

U.S. PATENT DOCUMENTS

| | | | | |
|---|---|---|---|---|
| 5,311,288 | A * | 5/1994 | Shahar | G01B 11/306 |
| | | | | 250/201.3 |
| 6,107,637 | A * | 8/2000 | Watanabe | B82Y 10/00 |
| | | | | 250/208.1 |
| 6,124,934 | A * | 9/2000 | Shahar | G01B 11/06 |
| | | | | 356/624 |
| 8,422,031 | B2 * | 4/2013 | Buermann | G02B 21/247 |
| | | | | 356/601 |
| 2010/0193686 | A1 * | 8/2010 | Watanabe | B82Y 10/00 |
| | | | | 250/307 |
| 2014/0240700 | A1 * | 8/2014 | Ogawa | G01N 21/956 |
| | | | | 356/244 |

OTHER PUBLICATIONS

Final Office Action dated Nov. 25, 2019 in Taiwanese Patent Application No. 107142049 (with unedited computer generated English translation), 8 pages.

* cited by examiner

DISPLACEMENT MEASURING APPARATUS, ELECTRON BEAM INSPECTION APPARATUS, AND DISPLACEMENT MEASURING METHOD

CROSS-REFERENCE TO RELATED APPLICATION

This application is based upon and claims the benefit of priority from prior Japanese Patent Application No. 2017-244772 filed on Dec. 21, 2017 in Japan, the entire contents of which are incorporated herein by reference.

BACKGROUND OF THE INVENTION

Field of the Invention

Embodiments of the present invention relate to a displacement measuring apparatus, electron beam inspection apparatus, and displacement measuring method. For example, they relate to a method of measuring a height displacement of a target object used in the inspection apparatus which inspects a pattern by acquiring a secondary electron image of a pattern image emitted by electron beam irradiation.

Description of Related Art

In recent years, with the advance of high integration and large capacity of LSI (Large Scale Integration or Integrated circuit), the line width (critical dimension) required for circuits of semiconductor elements is becoming increasingly narrower. Also, in recent years, with miniaturization of dimensions of LSI patterns formed on a semiconductor wafer, dimension to be detected as a pattern defect is becoming extremely small. Therefore, the pattern inspection apparatus which inspects defects of the LSI patterns needs to be highly accurate.

As an inspection method, there is known a method of comparing a measured image obtained by imaging a pattern formed on the substrate at a predetermined magnification, with design data or with another measured image obtained by capturing an identical pattern on the substrate. For example, the methods described below are known as pattern inspection, "die-to-die inspection" and "die-to-database inspection": the "die-to-die inspection" method compares data of measured images obtained by imaging identical patterns at different positions on the same substrate; and the "die-to-database inspection" method generates image data (reference image) of a design pattern and compares it with a measured image obtained by imaging a pattern. With respect to an inspection method employed in the inspection apparatus described above, there has been developed an inspection apparatus in which a substrate to be inspected (inspection substrate) is placed on the stage, and which acquires a pattern image by irradiating the inspection substrate with multiple electron beams in order to detect a secondary electron, corresponding to each beam, emitted from the inspection substrate (e.g., refer to Japanese Patent Application Laid-open (JP-A) No. 2011-155119). In a pattern inspection apparatus using multiple beams, a secondary electron image obtained using the multiple beams is compared with a reference image.

It is necessary, in the pattern inspection apparatus, to focus an irradiating electron beam on the inspection substrate. However, the height of the surface of the inspection substrate is not uniform because it varies. Examples of causes of the height displacement of the substrate surface are flexure of the substrate, up-and-down motion of the moving stage, and the like.

Therefore, the inspection apparatus measures a height displacement of the substrate. As a method of measuring the displacement of the substrate, there is used a displacement measuring apparatus of the optical lever type. However, when the inspection substrate is irradiated with a beam for measuring displacement, if a pattern exists at the beam irradiation position, diffracted light occurs due to the pattern. Then, under the influence of this diffracted light, deviation may occur at the measurement position of the light received. Accordingly, there is a problem in that an error may arise in a measured value of the height displacement.

BRIEF SUMMARY OF THE INVENTION

According to one aspect of the present invention, a displacement measuring apparatus includes an illumination optical system configured to irradiate, from an oblique direction, a surface of a target object with a beam, a sensor configured to receive a reflected light from the surface of the target object irradiated with the beam, an optical system configured to diverge the reflected light in a Fourier plane with respect to the surface of the target object, a camera configured to image a diverged beam in the Fourier plane, a gravity center shift amount calculation circuitry configured to calculate a gravity center shift amount of the reflected light in a light receiving surface of the sensor, based on a light quantity distribution of the beam imaged by the camera, and a measurement circuitry configured to measure a heightwise displacement of the surface of the target object by an optical lever method, using information on a corrected gravity center position which is obtained by correcting a gravity center position of the reflected light received by the sensor by using the gravity center shift amount.

According to another aspect of the present invention, an electron beam inspection apparatus includes an illumination optical system configured to irradiate, with a beam, from an oblique direction a surface of a target object with a figure pattern formed thereon, a sensor configured to receive a reflected light from the surface of the target object irradiated with the beam, an optical system configured to diverge the reflected light in a Fourier plane with respect to the surface of the target object, a camera configured to image a diverged beam in the Fourier plane, a gravity center shift amount calculation circuitry configured to calculate a gravity center shift amount of the reflected light in a light receiving surface of the sensor, based on a light quantity distribution of the beam imaged by the camera, a measurement circuitry configured to measure a heightwise displacement of the surface of the target object by an optical lever method, using information on a corrected gravity center position which is obtained by correcting a gravity center position of the reflected light received by the sensor by using the gravity center shift amount, a secondary electron image acquisition mechanism configured to acquire a secondary electron image of the figure pattern by scanning the surface of the target object with an electron beam while adjusting a focus position of the electron beam based on a measured value of heightwise displacement of the surface of the target object, and by detecting a secondary electron including a reflected electron emitted from the target object due to the scanning with the electron beam, and a comparison circuitry configured to compare, using a reference image, the secondary electron image with the reference image.

According to yet another aspect of the present invention, a displacement measuring method includes receiving, by a sensor, a reflected light from a surface of a target object, due to that the surface of the target object is irradiated from an oblique direction with a beam, imaging, by a camera, a diverged beam in a Fourier plane with respect to the surface of the target object, calculating a gravity center shift amount of the reflected light in a light receiving surface of the sensor, based on a light quantity distribution of the beam imaged by the camera, and measuring a heightwise displacement of the surface of the target object by an optical lever method, using information on a corrected gravity center position which is obtained by correcting a gravity center position of the reflected light received by the sensor by using the gravity center shift amount, and outputting a measured result.

DETAILED DESCRIPTION OF THE INVENTION

Embodiments below describe a displacement measuring apparatus which can correct a measurement error of height displacement when the height displacement of the substrate with a pattern formed thereon is measured, and an inspection apparatus employing the displacement measuring apparatus.

First Embodiment

Moreover, embodiments below describe, as an example of the method of taking an image (acquiring an inspection image) of a pattern formed on the inspection substrate, the case where the inspection substrate is irradiated with multiple electron beams in order to obtain a secondary electron image. It is not limited thereto. It is also preferable, as the method of taking an image of a pattern formed on the inspection substrate, for example, to irradiate the inspection substrate with a single electron beam in order to obtain a secondary electron image (acquire an inspection image).

Figure 1:
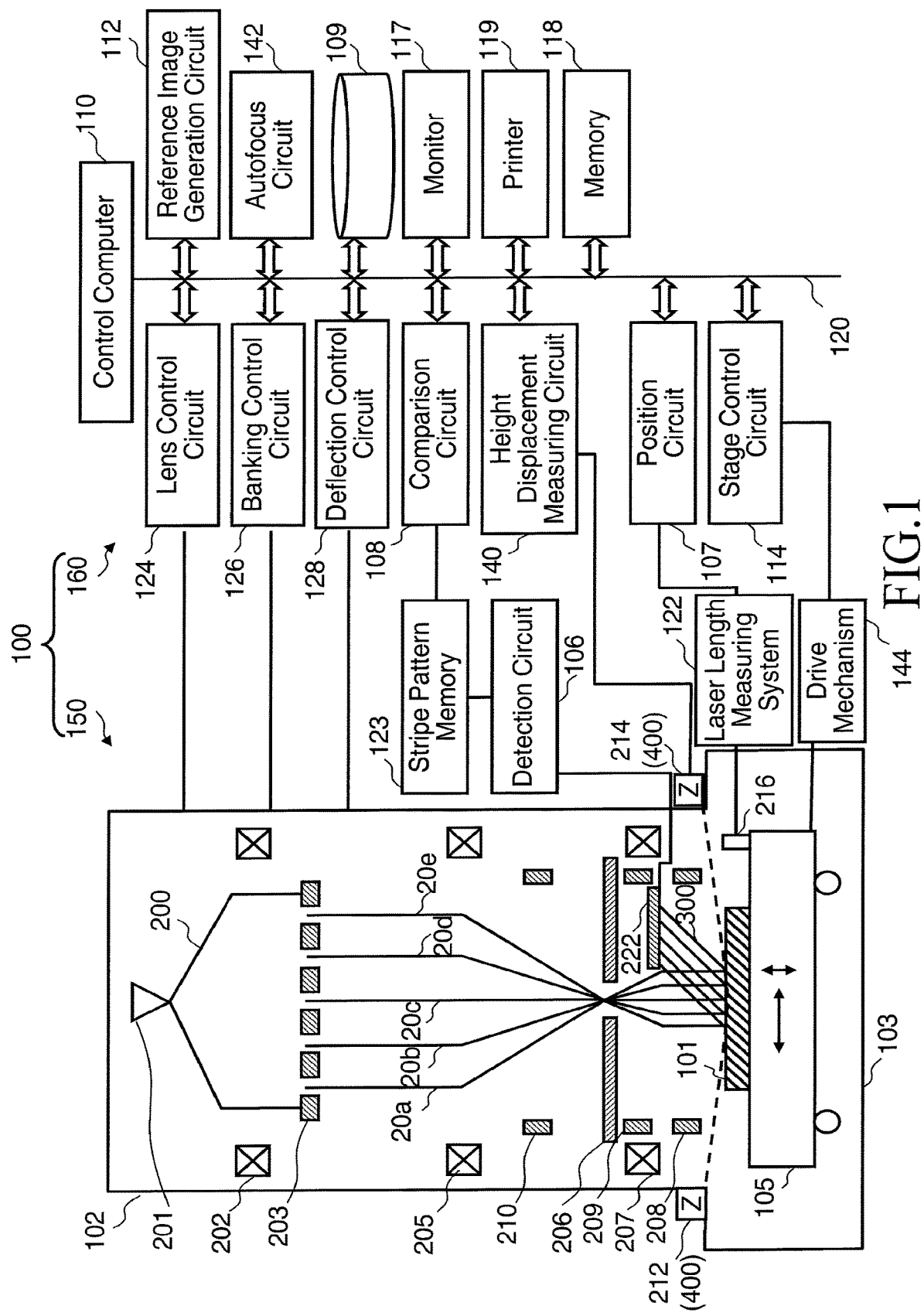
FIG. 1 shows a configuration of a pattern inspection apparatus according to a first embodiment.

FIG. 1 shows a configuration of a pattern inspection apparatus according to a first embodiment. In FIG. 1, an inspection apparatus 100 for inspecting patterns formed on the substrate is an example of an electron beam inspection apparatus and a pattern inspection apparatus. The inspection apparatus 100 includes an image acquisition mechanism 150 (secondary electron image acquisition mechanism) and a control system 160 (control unit). The image acquisition mechanism 150 includes an electron beam column 102 (electron optical column), an inspection chamber 103, a projection device 212, a light receiving device 214, a detection circuit 106, a stripe pattern memory 123, a laser length measuring system 122, and a drive mechanism 144. In the electron beam column 102, there are disposed an electron gun 201, an illumination lens 202, a shaping aperture array substrate 203, a reducing lens 205, a limiting aperture substrate 206, an objective lens 207, a main deflector 208, a sub deflector 209, a common blanking deflector 210, and a detector 222.

The projection device 212 and the light receiving device 214 are disposed on both sides across the electron beam column 102, on the inspection chamber 103, for example. However, it is not limited thereto. The projection device 212 and the light receiving device 214 may be disposed in the inspection chamber 103 or the electron beam column 102.

In the inspection chamber 103, there is disposed a stage 105 movable in the x, y, and z directions. On the stage 105, there is placed a substrate 101 (target object) on which a plurality of figure patterns to be inspected are formed. The substrate 101 may be an exposure mask, or a semiconductor substrate such as a silicon wafer. The substrate 101 is placed with its pattern forming surface facing upward, on the stage 105, for example. Moreover, on the stage 105, there is disposed a mirror 216 which reflects a laser beam for measuring a laser length emitted from the laser length measuring system 122 disposed outside the inspection chamber 103. The detector 222 is connected, at the outside of the electron beam column 102, to the detection circuit 106. The detection circuit 106 is connected to the stripe pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a height displacement measuring circuit 140, an autofocus (automatic focusing) control circuit 142, a storage device 109 such as a magnetic disk drive, a monitor 117, a memory 118, and a printer 119. The stripe pattern memory 123 is connected to the comparison circuit 108. The stage 105 is driven by the drive mechanism 144 under the control of the stage control circuit 114. The stage 105 can be moved by a drive system, such as a three (x-, y-, and θ-) axis motor which moves in the directions of x, y, and θ. For example, a step motor can be used as each of these x, y, and θ motors (not shown). The stage 105 is movable in the z direction by using a piezoelectric element, etc. The movement position of the stage 105 is measured by the laser length measuring system 122, and supplied (transmitted) to the position circuit 107. Based on the principle of laser interferometry, the laser length measuring system 122 measures the position of the stage 105 by receiving reflected light from the mirror 216.

A displacement measuring apparatus 400 of the first embodiment includes the projection device 212, the light receiving device 214, and the height displacement measuring circuit 140 shown in FIG. 1. A light emitted from the projection device 212 irradiates the substrate 101 from an oblique direction, and is reflected at the surface of the substrate 101 to enter the light receiving device 214. Using the displacement amount of the light received, the height-wise displacement of the surface of the substrate 101 is measured by the optical lever method.

To the electron gun 201, there is connected a high voltage power supply circuit (not shown). The high voltage power supply circuit applies an acceleration voltage between the cathode and the anode (not shown) in the electron gun 201. In addition to this applied acceleration voltage, by applying a predetermined bias voltage and heating the cathode at a predetermined temperature, electrons emitted from the cathode are accelerated to become electron beams which are to be emitted. For example, electron lenses are used as the illumination lens 202, the reducing lens 205, and the objective lens 207, and all of them are controlled by the lens control circuit 124. The common blanking deflector 210 is composed of electrode pairs of two poles, for example, and controlled by the blanking control circuit 126. The main deflector 208 and the sub deflector 209 are composed of electrodes of at least four poles, and controlled by the deflection control circuit 128.

In the case of the substrate 101 being an exposure mask, when a plurality of figure patterns are formed on the exposure mask by a writing apparatus (not shown), such as an electron beam writing apparatus, writing data used by the writing apparatus is input to the inspection apparatus 100 from the outside, and stored in the storage device 109. In the case of the substrate 101 being a semiconductor substrate, exposure image data defining an exposure image, to be formed on the semiconductor substrate, used when a mask pattern of the exposure mask is exposed and transferred onto the semiconductor substrate, is input to the inspection apparatus 100 from the outside, and stored in the storage device 109. The exposure image data may be generated by a space image taking device (not shown) and the like, for example.

FIG. 1 shows configuration elements necessary for describing the first embodiment. It should be understood that other configuration elements generally necessary for the inspection apparatus 100 may also be included therein.

Figure 2:
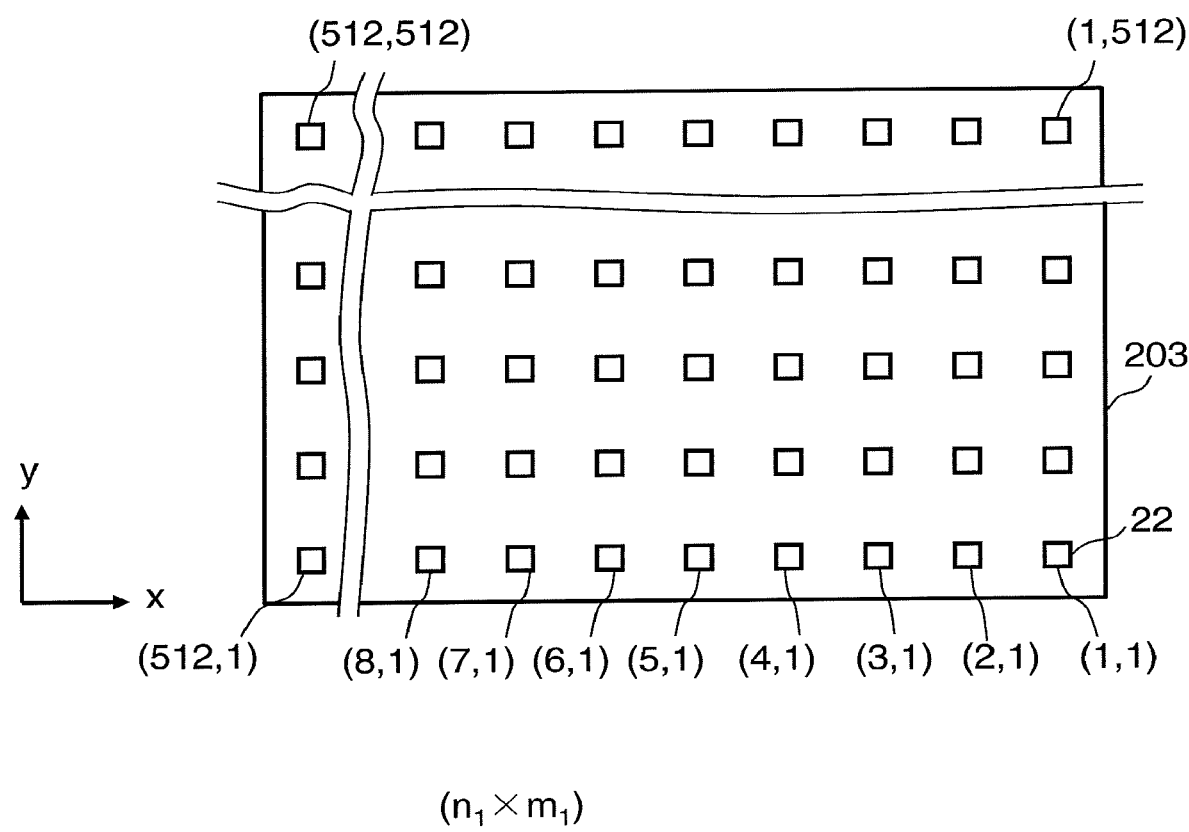
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of $n_1$ columns wide (x direction) and $m_1$ rows long (y direction) are two-dimensionally formed, like a matrix, at a predetermined arrangement pitch in the shaping aperture array substrate 203, where one of $n_1$ and $m_1$ is an integer of 1 or more, and the other is an integer of 2 or more. In FIG. 2, for example, holes 22 of 512 (columns in x direction)×512 (rows in y direction) are formed. Each of the holes 22 is a quadrangle (rectangle) having the same dimension, shape, and size. Alternatively, each of the holes 22 may be a circle with the same outer diameter. The multiple beams 20 are formed by letting portions of an electron beam 200 individually pass through a corresponding one of a plurality of holes 22. Here, the case in which the holes 22 of two or more rows and columns are arranged in both the x and y directions is shown, but the arrangement is not limited thereto. For example, it is also acceptable that a plurality of holes 22 are arranged in only one row (x direction) or in only one column (y direction). That is, in the case of only one row, a plurality of holes 22 are arranged in the x direction as a plurality of columns, and in the case of only one column, a plurality of holes 22 are arranged in the y direction as a plurality of rows. The method of arranging the holes 22 is not limited to the case of FIG. 2 where holes are arranged like a grid in the width and length directions. For example, with respect to the k-th and the (k+1)th rows which are arrayed in the length direction (y direction) and each of which is in the x direction, each hole in the k-th row and each hole in the (k+1)th row may be mutually displaced in the width direction (x direction) by a dimension "a". Similarly, with respect to the (k+1)th and the (k+2)th rows which are arrayed in the length direction (y direction) and each of which is in the x direction, each hole in the (k+1)th row and each hole in the (k+2)th row may be mutually displaced in the width direction (x direction) by a dimension "b".

Next, operations of the image acquisition mechanism 150 in the inspection apparatus 100 are described below. The electron beam 200 emitted from the electron gun 201 (emission unit) almost perpendicularly (e.g., vertically) illuminates the whole of the shaping aperture array substrate 203 by the illumination lens 202. A plurality of quadrangular holes (openings) 22 are formed in the shaping aperture array substrate 203. The region including all the plurality of holes 22 is irradiated with the electron beam 200. For example, a plurality of quadrangular (rectangular) electron beams (multiple beams) 20a to 20e are formed by letting portions of the electron beam 200, which irradiate the positions of a plurality of holes 22, individually pass through a corresponding one of the plurality of holes 22 in the shaping aperture array substrate 203.

The multiple beams 20a to 20e formed by the shaping aperture array substrate 203 are reduced by the reducing lens 205, and travel toward the center hole of the limiting aperture substrate 206. At this stage, when all of the multiple beams 20a to 20e are collectively deflected by the common blanking deflector 210 disposed between the reducing lens 205 and the limiting aperture substrate 206, they deviate from the center hole of the limiting aperture substrate 206 so as to be blocked by the limiting aperture substrate 206. On the other hand, when the multiple beams 20a to 20e are not deflected by the common blanking deflector 210, they pass through the center hole of the limiting aperture substrate 206 as shown in FIG. 1. Blanking control is provided by ON/OFF of the common blanking deflector 210 to collectively control ON/OFF of the beams. Thus, the limiting aperture substrate 206 blocks the multiple beams 20a to 20e which were deflected to be in the OFF condition by the common blanking deflector 210. Then, the multiple beams 20a to 20e formed by the beams having been made during a period from becoming "beam ON" to becoming "beam OFF" and having passed through the limiting aperture substrate 206 are focused on the substrate 101 (target object) by the objective lens 207 to be a pattern image (beam diameter) of a desired reduction ratio. Then, the whole multiple beams 20 having passed through the limiting aperture substrate 206 are collectively deflected in the same direction by the main deflector 208 and the sub deflector 209 in order to irradiate respective beam irradiation positions on the substrate 101. In such a case, the main deflector 208 collectively deflects all of the multiple beams 20 to the reference position of the mask die to be scanned by the multiple beams 20. When the scanning is performed while continuously moving the stage 105, tracking deflection is performed to follow the movement of the stage 105. Then, the sub deflector 209 collectively deflects all of the multiple beams 20 so that each beam may scan a corresponding region. Ideally, the multiple beams 20 irradiating at a time are aligned at the pitch obtained by multiplying the arrangement pitch of a plurality of holes 22 in the shaping aperture array substrate 203 by the desired reduction ratio (1/a) described above. Thus, the electron beam column 102 irradiates the substrate 101 with two-dimensional $m_1 \times n_1$ multiple beams 20 at a time. A flux of secondary electrons (multiple secondary electrons 300) including reflected electrons, each corresponding to each of the multiple beams 20, is emitted from the substrate 101 due to that desired positions on the substrate 101 are irradiated with the multiple beams 20. The multiple secondary electrons 300 emitted from the substrate 101 are detected when entering the detector 422. The multiple secondary electrons 300 have a smaller kinetic energy (motion energy) compared to the multiple beams 20 for irradiation. Therefore, it is also preferable to deflect only the multiple secondary electrons 300 having a small kinetic energy toward the detector 222 by generating a weak electric field on the substrate 101 by a deflector, etc. (not shown), without deflecting the multiple beams 20 for irradiation having been accelerated by a large acceleration voltage.

Figure 3:
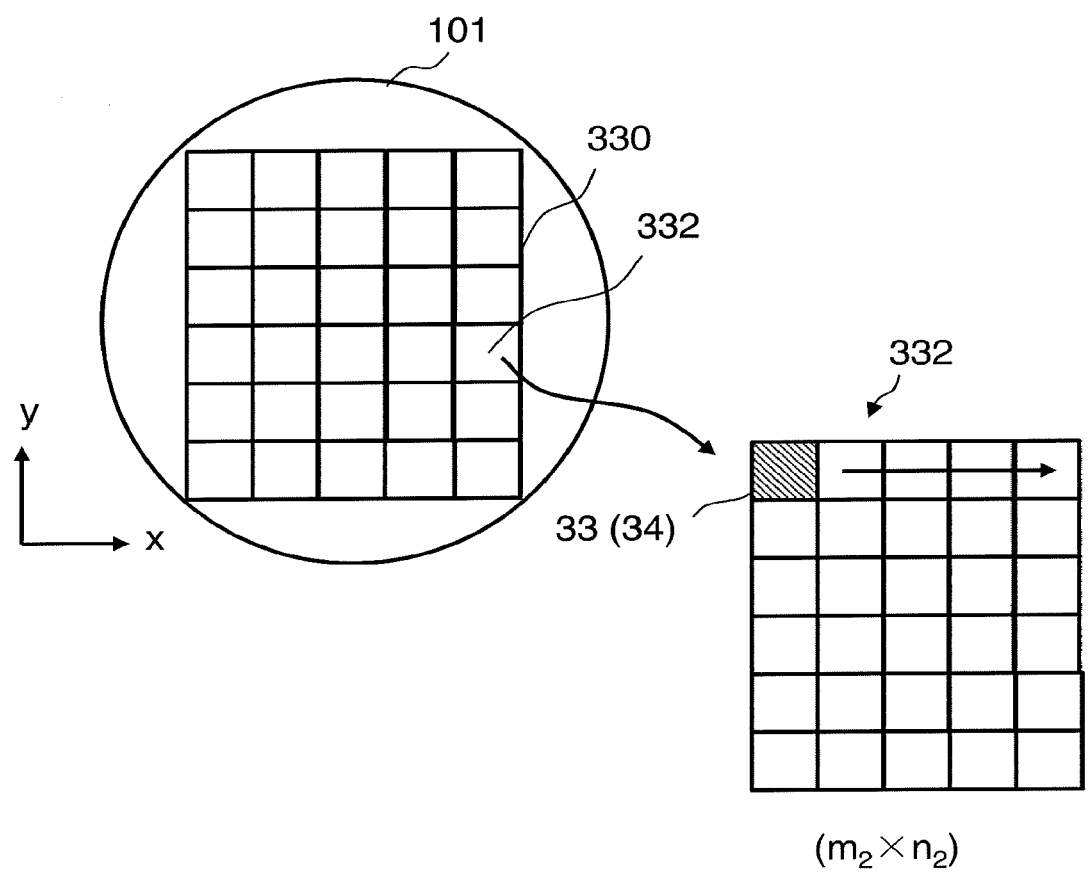
FIG. 3 shows an example of a plurality of chip regions formed on the substrate of the first embodiment.

FIG. 3 shows an example of a plurality of chip regions formed on the substrate of the first embodiment. In the case of FIG. 3, the substrate 101 is a semiconductor substrate (wafer). In FIG. 3, a plurality of chips (wafer die) 332 in a two-dimensional array are formed in an inspection region 330 of the substrate 101. A mask pattern for one chip formed on the exposure mask substrate is reduced to ¼, for example, and exposed/transferred onto each chip 332 by an exposure device (stepper) (not shown). The inside of each chip 332 is divided into a plurality of mask dies 33 of $m_2$ columns wide (width in the x direction) and $n_2$ rows long (length in the y direction) (each of $m_2$ and $n_2$ is an integer of 2 or greater), for example. In the first embodiment, the mask die 33 serves as a unit inspection region.

Figure 4:
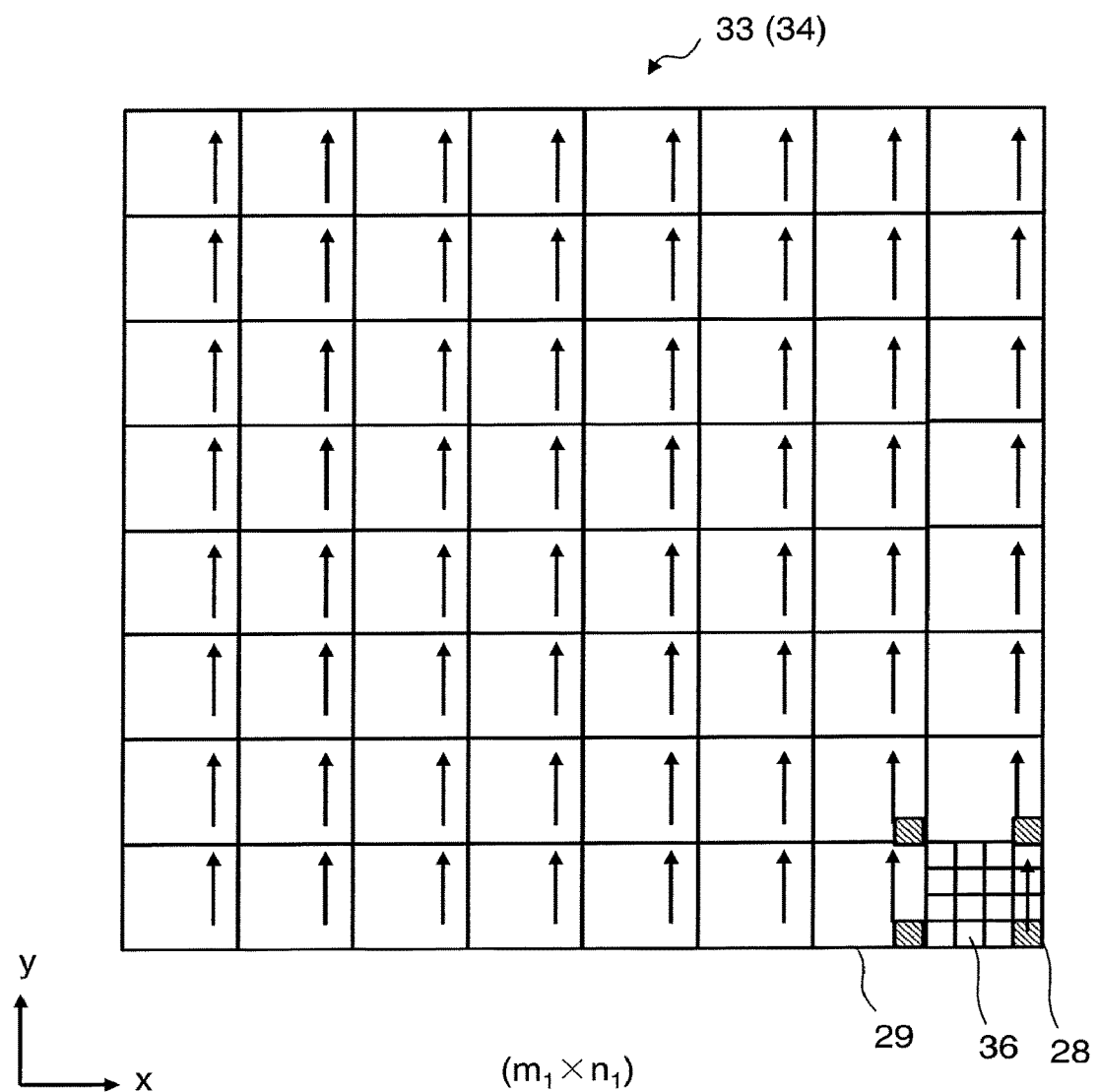
FIG. 4 shows an example of an irradiation region of multiple beams and a measurement pixel according to the first embodiment.

FIG. 4 shows an example of an irradiation region of multiple beams and a measurement pixel according to the first embodiment. In FIG. 4, each mask die 33 is divided into a plurality of mesh regions by the size of each beam of multiple beams, for example. Each mesh region serves as a measurement pixel 36 (unit irradiation region). FIG. 4 illustrates the case of multiple beams of 8×8 (rows by columns). The size of the irradiation region 34 that can be irradiated with one irradiation of the multiple beams 20 is defined by (x direction size obtained by multiplying pitch between beams in x direction of the multiple beams 20 by the number of beams in the x direction)×(y direction size obtained by multiplying pitch between beams in y direction of the multiple beams 20 by the number of beams in the y direction). In the case of FIG. 4, the irradiation region 34 and the mask die 33 are of the same size. However, it is not limited thereto. The irradiation region 34 may be smaller than the mask die 33, or larger than it. In the irradiation region 34, there are shown a plurality of measurement pixels 28 (irradiation positions of beams of one shot) which can be irradiated with one irradiation of the multiple beams 20. In other words, the pitch between adjacent measurement pixels 28 serves as the pitch between beams of the multiple beams. In the case of FIG. 4, one sub-irradiation region 29 is a square region surrounded at four corners by four adjacent measurement pixels 28, and including one of the four measurement pixels 28. In the example of FIG. 4, each sub-irradiation region 29 is composed of 4×4 pixels 36.

In the scanning operation according to the first embodiment, scanning is performed for each mask die 33. FIG. 4 shows the case of scanning one mask die 33. When all of the multiple beams 20 are used, there are arranged $m_1 \times n_1$ sub-irradiation regions 29 in the x and y directions (two-dimensionally) in one irradiation region 34. The stage 105 is moved to a position where the first mask die 33 can be irradiated with the multiple beams 20. The main deflector 208 collectively deflects all of the multiple beams 20 to the reference position of the mask die 33 to be scanned by the multiple beams 20. The stage 105 is stopped at that position, and then, the inside of the mask die 33 concerned is scanned regarded as the irradiation region 34. When scanning while continuously moving the stage 105, the main deflector 208 performs tracking deflection such that it further follows the movement of the stage 105. Each beam of the multiple beams 20 is associated with any one of the sub-irradiation regions 29 which are different from each other. At the time of each shot, each beam irradiates one measurement pixel 28 corresponding to the same position in the associated sub-irradiation region 29. In the case of FIG. 4, the sub deflector 209 performs deflection such that the first shot of each beam irradiates the first measurement pixel 36 from the right in the bottom row in the sub-irradiation region 29 concerned. Thus, irradiation of the first shot is performed. Then, the beam deflection position is shifted in the y direction by the amount of one measurement pixel 36 by collectively deflecting all of the multiple beams 20 by the sub deflector 209, and the second shot irradiates the first measurement pixel 36 from the right in the second row from the bottom in the sub-irradiation region 29 concerned. Similarly, the third shot irradiates the first measurement pixel 36 from the right in the third row from the bottom in the sub-irradiation region 29 concerned. The fourth shot irradiates the first measurement pixel 36 from the right in the fourth row from the bottom in the sub-irradiation region 29 concerned. Next, the beam deflection position is shifted to the second measurement pixel 36 from the right in the bottom row by collectively deflecting all of the multiple beams 20 by the sub deflector 209. Similarly, the measurement pixels 36 are irradiated in order in the y direction. By repeating this operation, one beam irradiates all the measurement pixels 36 in order in one sub-irradiation region 29. By performing one shot, the multiple secondary electrons 300 corresponding to a plurality of shots whose maximum number is the same as the number of a plurality of holes 22 are detected at a time by the multiple beams formed by passing through the plurality of holes 22 in the shaping aperture array substrate 203.

As described above, the whole multiple beams 20 scans the mask die 33 as the irradiation region 34, and that is, each beam individually scans one corresponding sub-irradiation region 29. After scanning one mask die 33 is completed, the irradiation region 34 is moved to a next adjacent mask die 33 in order to scan the next adjacent mask die 33. This operation is repeated to proceed scanning of each chip 332. Due to shots of the multiple beams 20, secondary electrons are emitted from the irradiated measurement pixels 36 at each shot time, and the multiple secondary electrons 300 are detected by the detector 222. According to the first embodiment, the detector 222 detects the multiple secondary electrons 300 emitted upward from each measurement pixel 36, for each measurement pixel 36 (or each sub-irradiation region 29) which is a unit detection region of the detector 222.

By performing scanning using the multiple beams 20 as described above, the scanning operation (measurement) can be performed at a speed higher than that of scanning by a single beam. The scanning of each mask die 33 may be performed by the "step and repeat" operation, alternatively it may be performed by continuously moving the stage 105. When the irradiation region 34 is smaller than the mask die 33, it will suffice to perform the scanning operation while moving the irradiation region 34 in the mask die 33 concerned.

When the substrate 101 is an exposure mask substrate, the chip region for one chip formed on the exposure mask substrate is divided into a plurality of stripe regions in a strip form by the size of the mask die 33 described above, for example. Then, for each stripe region, scanning is performed for each mask die 33 in the same way as described above. Since the size of the mask die 33 on the exposure mask substrate is the size before being transferred and exposed, it is four times the mask die 33 on the semiconductor substrate. Therefore, if the irradiation region 34 is smaller than the mask die 33 on the exposure mask substrate, the scanning operation for one chip increases (e.g., four times). However, since a pattern for one chip is formed on the exposure mask substrate, the number of times of scanning can be less compared to the case of the semiconductor substrate on which more than four chips are formed.

As described above, using the multiple beams 20, the image acquisition mechanism 150 scans the substrate 101 to be inspected, on which a figure pattern is formed, and detects the multiple secondary electron beams 300 emitted from the inspection substrate 101 due to it being irradiated with the multiple beams 20. Detected data on a secondary electron (measured image: secondary electron image: image to be inspected) from each measurement pixel 36 detected by the detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed on the substrate 101. Then, for example, when the detected data for one chip 332 has been accumulated, the accumulated data is transmitted as chip pattern data to the comparison circuit 108, with information data on each position from the position circuit 107.

Now concerning the substrate 101 to be inspected, its surface is not always perfectly flat. In many cases, the height position of the substrate surface is not uniform and varies due to unevenness of the surface, flexure (sagging) of the substrate, up-and-down motion of the stage during moving, and the like. Therefore, if the focus position is fixed to one point during a scanning operation, focus displacement may occur. Thus, it is necessary, in the inspection apparatus 100, to focus the multiple beams 20 (electron beams) to irradiate the inspection substrate 101. Accordingly, the displacement measuring apparatus 400 of the inspection apparatus 100 measures a heightwise displacement of the substrate 101. Then, a measured heightwise displacement Δz of the substrate 101 is used for autofocusing. In the first embodiment, a displacement measuring apparatus of the optical lever type is used as one of methods of measuring a displacement of the substrate. Since the diameter of the spot of the beam used by the displacement measuring apparatus 400 is larger than the pattern size formed on the substrate 101, the height displacement of the substrate 101 due to unevenness of patterns formed on the substrate 101 is averaged using measured values obtained by the displacement measuring apparatus 400. Since the wave length of height displacement of the substrate 101 due to unevenness of the surface, flexure of the substrate, up-and-down motion of the stage during moving and the like is larger than the spot diameter of beam, it can be sufficiently measured.

Figure 5:
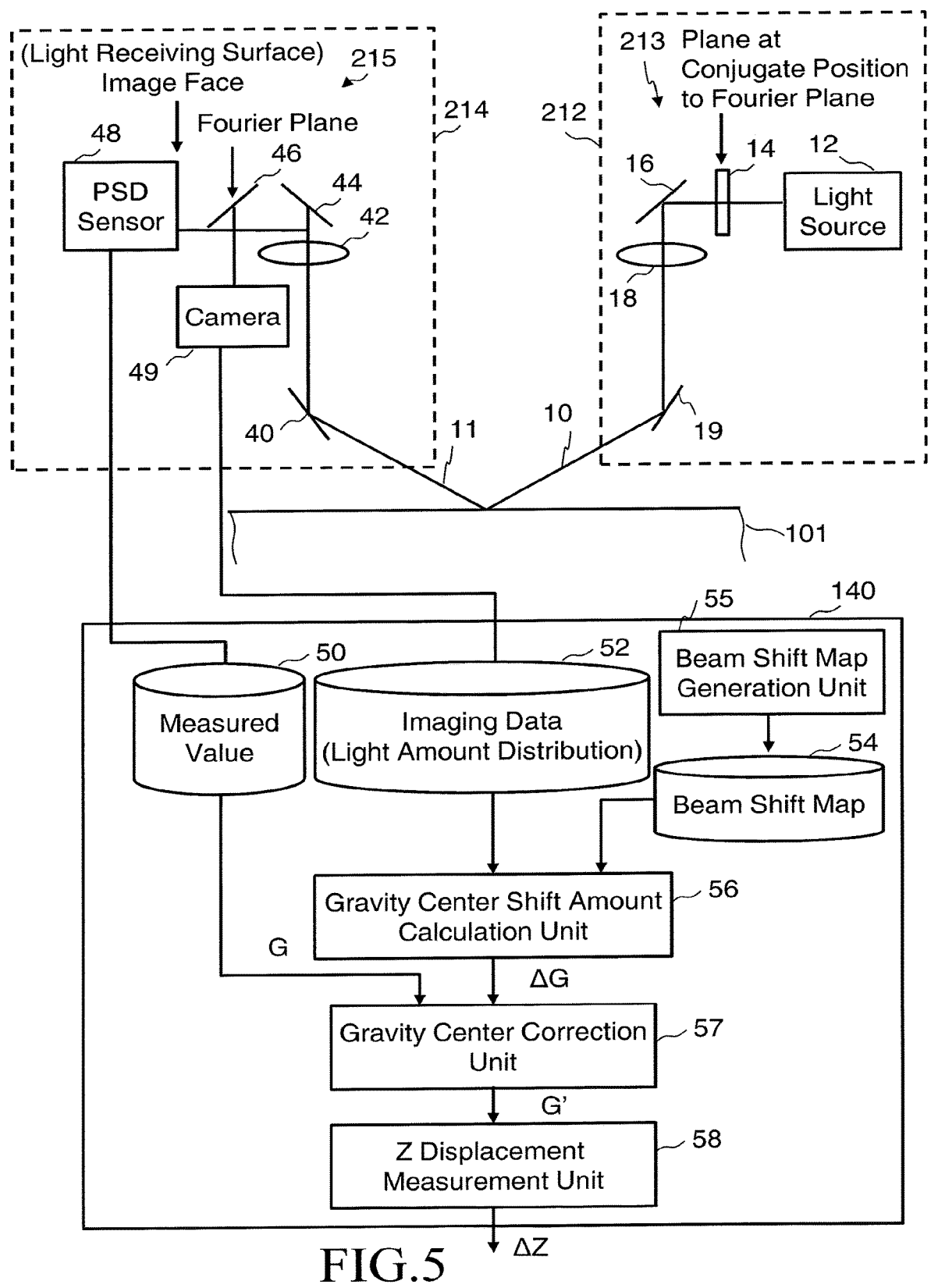
FIG. 5 shows a configuration of a displacement measuring apparatus according to the first embodiment.

FIG. 5 shows a configuration of a displacement measuring apparatus according to the first embodiment. In FIG. 5, the displacement measuring apparatus 400 includes the projection device 212, the light receiving device 214, and the height displacement measuring circuit 140.

In the projection device 212, there are arranged a light source 12, a pinhole substrate 14 that can be carried in and carried out, a mirror 16, a lens 18, and a mirror 19. An illumination optical system 213 is composed of the mirror 16, the lens 18, and the mirror 19. The illumination optical system 213 may include other optical elements such as lenses and/or mirrors in addition to the mirror 16, the lens 18, and the mirror 19. It is also preferable to use, for example, an LED, an optical fiber and the like, as the light source 12.

In the light receiving device 214, there are arranged a mirror 40, a lens 42, a mirror 44, a half mirror 46, a sensor 48, and a camera 49. An image-forming optical system 215 is composed of the mirror 40, the lens 42, and the mirror 44. The image-forming optical system 215 may include other optical elements such as lenses and/or mirrors in addition to the mirror 40, the lens 42, and the mirror 44. It is preferable to use a PSD (Position Sensitive Detector) sensor (optical position sensor) as the sensor 48.

In the light receiving device 214, the half mirror 46 (optical system) is arranged in the Fourier plane with respect to the surface of the substrate 101. The camera 49 is located at the position where a light diverged by the half mirror 46 enters. As an example of the Fourier plane, it corresponds to the position away from the lens 42 by the same distance in the opposite direction to the substrate 101 as the focal distance of the lens 42 towards the surface of the substrate 101.

In the height displacement measuring circuit 140, there are arranged storage devices 50, 52, and 54 such as magnetic disk drives, a beam shift map generation unit 55, a gravity center shift amount calculation unit 56, a gravity center correction unit 57, and a z displacement measurement unit 58. Each of the "units" such as the beam shift map generation unit 55, the gravity center shift amount calculation unit 56, the gravity center correction unit 57, and the z displacement measurement unit 58 includes a processing circuitry. As the processing circuitry, for example, an electric circuit, computer, processor, circuit board, quantum circuit, semiconductor device, or the like can be used. Each of the "units" may use a common processing circuitry (same processing circuitry), or different processing circuitries (separate processing circuitries). Input data required in the beam shift map generation unit 55, the gravity center shift amount calculation unit 56, the gravity center correction unit 57, and the z displacement measurement unit 58 and calculated results are stored in a memory (not shown) each time.

Figure 6:
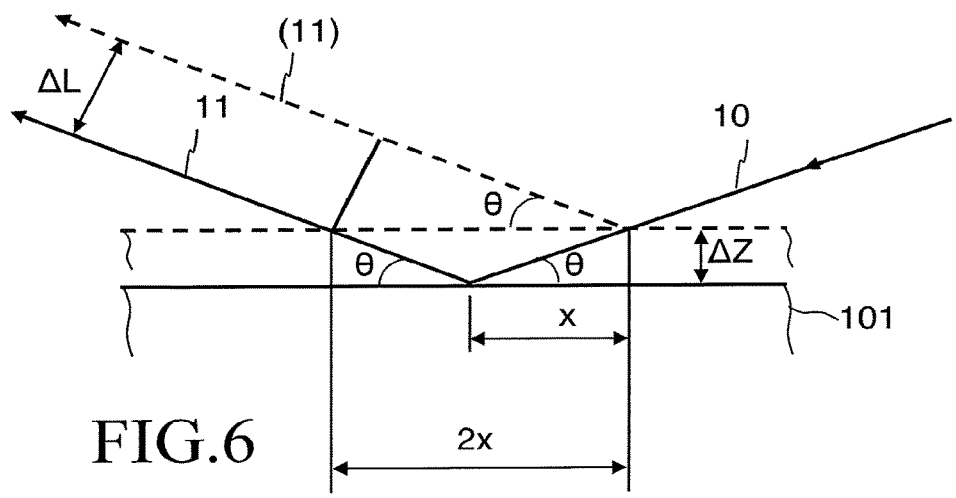
FIG. 6 illustrates principle of an optical lever method according to the first embodiment.

FIG. 6 illustrates the principle of the optical lever method according to the first embodiment. In FIG. 6, if the surface of the substrate 101 is obliquely irradiated with a light 10 of angle θ, a reflected light 11 (solid line) is reflected at the angle θ from the substrate 101. Here, if the surface of the substrate 101 is displaced in the height direction by Δz, the light 10 emitted from the same position collides the substrate 101 at the position shorter (in x direction) with respect to the surface of the substrate than the previous position by the displacement amount x, and the reflected light 11 (dotted line) is reflected at the angle θ from the substrate 101. Therefore, when the height position of the surface of the substrate 101 is displaced by Δz, the optical axis (gravity center) of the reflected light is displaced by ΔL. The displacement amount x can be defined by the following equation (1).

$$x = \Delta z / \tan \theta \quad (1)$$

Moreover, the distance ΔL between the gravity centers of the reflected light can be defined by the following equation (2).

$$\Delta L = 2x \cdot \sin \theta \quad (2)$$

Therefore, the distance ΔL between the gravity centers can be converted to the following equation (3).

$$\Delta L = 2 \cdot \Delta z / \tan\theta \cdot \sin\theta \quad (3)$$

Therefore, the heightwise displacement Δz of the surface of the substrate 101 can be defined by the following equation (4).

$$\Delta z = \Delta L \cdot \tan\theta / (2 \cdot \sin\theta) \quad (4)$$

Accordingly, the heightwise displacement Δz can be calculated by previously measuring the distance ΔL between the gravity centers by a sensor in the state where the incident angle θ of light is fixed. However, if a pattern exists at the irradiation position of the beam for measuring displacement on the substrate 101, diffracted light occurs due to this pattern. Therefore, under the influence of the diffracted light, an error may occur in the measured value of height displacement.

Figure 7A:
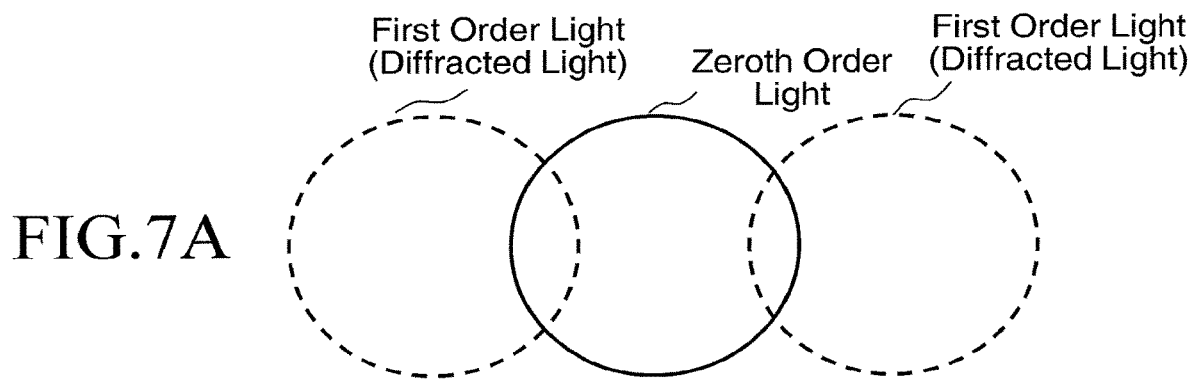
FIGS. 7A and 7B show examples of reflected light and diffracted light according to the first embodiment.
Figure 7B:
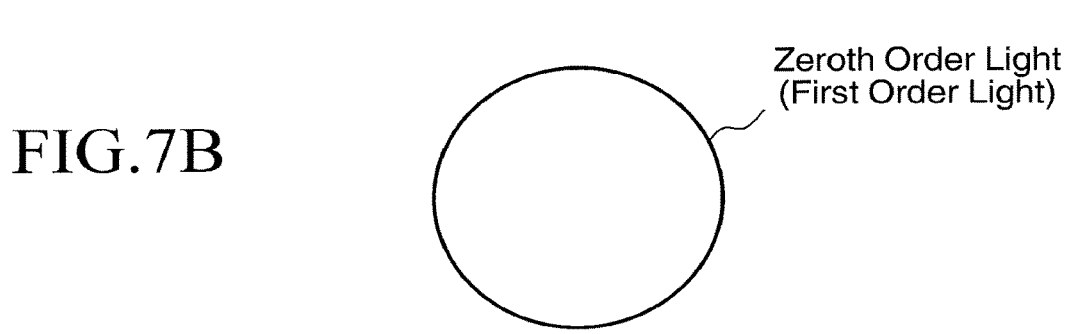

FIGS. 7A and 7B show examples of reflected light and diffracted light according to the first embodiment. FIG. 7A shows an example of the light passage region in the Fourier plane of the substrate 101. When there is no pattern on the substrate 101, only reflected light (zero order light) of the light irradiating the substrate 101 enters the image-forming optical system 215 side, and no diffracted light occurs. Therefore, in the Fourier plane with respect to the surface of the substrate 101, the passage region of diffracted light (first order light) in the light regions shown in FIG. 7A does not appear, and reflected light (zero order light) passes therethrough. On the other hand, when a pattern exists on the substrate 101, diffracted light (first order light) caused by the pattern enters the image-forming optical system 215 side in addition to the reflected light (zero order light) irradiating the substrate 101. Therefore, as shown in FIG. 7A, in the Fourier plane with respect to the surface of the substrate 101, in addition to the passage region of reflected light (zero order light), passage regions of diffracted lights (first order light) are generated, for example, at the both sides of the passage region of the reflected light (zero order light). Since appearance of diffracted light (first order light) depends on a pattern, the way of the appearance varies in the case of different patterns. Therefore, the passage region of diffracted light (first order light) is not always at the same position.

Here, even when diffracted light (first order light) occurs, if the image-forming optical system 215 of the displacement measuring apparatus 400 is perfectly aplanatic, reflected light (zero order light) and diffracted light (first order light) of a beam irradiating the substrate 101 overlap with each other completely on the surface of the sensor 48 being an image formation surface by the image-forming optical system 215, as shown in FIG. 7B. Therefore, regardless of the way of appearance of diffracted light (first order light), the gravity center position of the light focused on the surface of the sensor 48 by the image-forming optical system 215 is the gravity center position of reflected light (zero order light). Accordingly, no deviation occurs at the gravity center position of a measured light. However, it is substantially difficult to manufacture the image-forming optical system 215 of the displacement measuring apparatus 400 to be perfectly aplanatic.

When aberration exists in the image-forming optical system 215 of the displacement measuring apparatus 400, since each of beams composing reflected lights (zero order light) and diffracted lights (first order light) is refracted according to the aberration, the gravity center position of the light focused on the surface of the sensor 48 by the image-forming optical system 215 deviates from the gravity center position of the reflected light (zero order light). This deviation varies depending on the way of appearance of the diffracted light (first order light). Therefore, an error will be included in the gravity center position G being the basis of the distance ΔL between gravity centers used as a parameter of the optical lever method.

Even when aberration exists in the image-forming optical system 215 of the displacement measuring apparatus 400, if there is no pattern on the substrate 101, since diffracted light (first order light) does not occur, the reflected light (zero order light) at each height position of the substrate 101 is not affected by the diffracted light when the reflected light (zero order light) at each height position of the substrate 101 is refracted according to the aberration. Therefore, even when error is included in respective gravity centers G, such error is cancelled out in the distance ΔL between gravity centers being a relative distance.

Accordingly, when a light quantity distribution of reflected light (zero order light), diffracted light (first order light), etc. is generated in a Fourier plane, and aberration exists in the image-forming optical system 215 of the displacement measuring apparatus 400, error which has not been cancelled out is included in the distance ΔL between gravity centers used as a parameter of the optical lever method. Consequently, it becomes difficult to highly accurately measure the heightwise displacement Δz of the surface of the substrate 101. Then, in the first embodiment, based on the light quantity distribution of the beam in the Fourier plane with respect to the surface of the substrate 101, the gravity center shift amount indicating deviation of the gravity center position is calculated to correct the measured distance ΔL between gravity centers.

Figure 8:
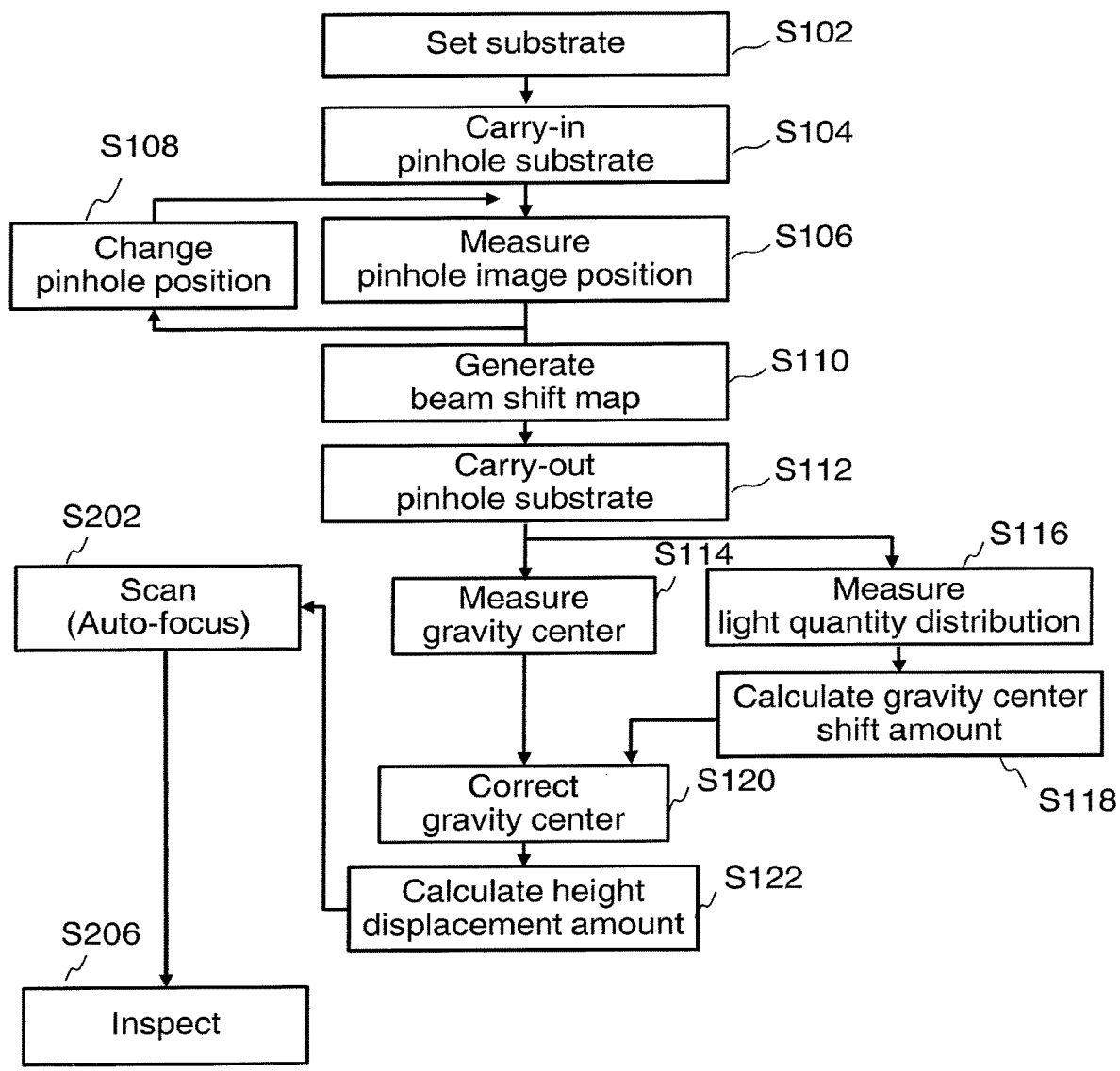
FIG. 8 is a flowchart showing main steps of a pattern inspection method according to the first embodiment.

FIG. 8 is a flowchart showing main steps of a pattern inspection method according to the first embodiment. In FIG. 8, the pattern inspection method of the first embodiment executes a series of steps: a substrate setting step (S102), a pinhole substrate carrying-in step (S104), a pinhole image position measuring step (S106), a pinhole position changing step (S108), a beam shift map generating step (S110), a pinhole substrate carrying-out step (S112), a beam gravity center measuring step (S114), a light quantity distribution measuring step (S116), a gravity center shift amount calculating step (S118), a gravity center correcting step (S120), a height displacement amount calculating step (S122), a scanning (autofocusing) step (S202), and an inspecting step (S206).

In the series of steps, the substrate setting step (S102), the pinhole substrate carrying-in step (S104), the pinhole image position measuring step (S106), the pinhole position changing step (S108), the beam shift map generating step (S110), the pinhole substrate carrying-out step (S112), the beam gravity center measuring step (S114), the light quantity distribution measuring step (S116), the gravity center shift amount calculating step (S118), the gravity center correcting step (S120), and the height displacement amount calculating step (S122) are executed as a position displacement measuring method according to the first embodiment.

Moreover, the substrate setting step (S102), the pinhole substrate carrying-in step (S104), the pinhole image position measuring step (S106), the pinhole position changing step (S108), the beam shift map generating step (S110), and the pinhole substrate carrying-out step (S112) are performed as preprocessing of the inspecting step. Each of the beam gravity center measuring step (S114), the light quantity distribution measuring step (S116), the gravity center shift amount calculating step (S118), the gravity center correcting step (S120), and the height displacement amount calculating step (S122) is performed in parallel with the scanning (autofocusing) step (S202).

In the substrate setting step (S102), an evaluation substrate (not shown) is disposed on the stage 105. In that case, the height position of the evaluation substrate is preferably set at the design focus position of the objective lens. A substrate on which no pattern is formed is preferably used as the evaluation substrate. Preferably, the height position of the evaluation substrate is not changed.

In the pinhole substrate carrying-in step (S104), the pinhole substrate 14 is carried in on the optical axis in the projection device 212, and the pinhole substrate 14 in which a pinhole is formed is disposed at the position conjugate to the Fourier plane with respect to the surface of the substrate 101. The pinhole substrate 14 may be carried in by a driving device (not shown), or may be disposed at a predetermined position by an artificial operation.

In the pinhole image position measuring step (S106), the pinhole substrate 14 is irradiated with a light from the light source 12, and a pinhole image (aperture image) is formed. Then, the beam of the aperture image irradiates the substrate 101 by the illumination optical system 213.

Next, a reflected light of the aperture image reflected from the substrate 101 is focused on the light receiving surface of the sensor 48 by the image-forming optical system 215. In the sensor 48, the position of the incident reflected light of the aperture image is measured by calculation and output. If a PSD sensor, for example, is used as the sensor 48, the current output from the output terminals at the both ends of the light receiving region of the PSD sensor changes based on the resistance which is proportional to the distance from the light incident position to the output terminal. Accordingly, the gravity center position G of a beam spot on the sensor can be obtained based on the ratio of the current output from the output terminals at the both ends.

In the pinhole position changing step (S108), the pinhole substrate 14 is moved in order to change the position of the pinhole. Then, returning to the pinhole image position measuring step (S106), the position (gravity center position G) of a reflected light of the pinhole image at the pinhole position is measured. The same operation is repeated variably changing the position of the pinhole.

Figures 9A, 9B:
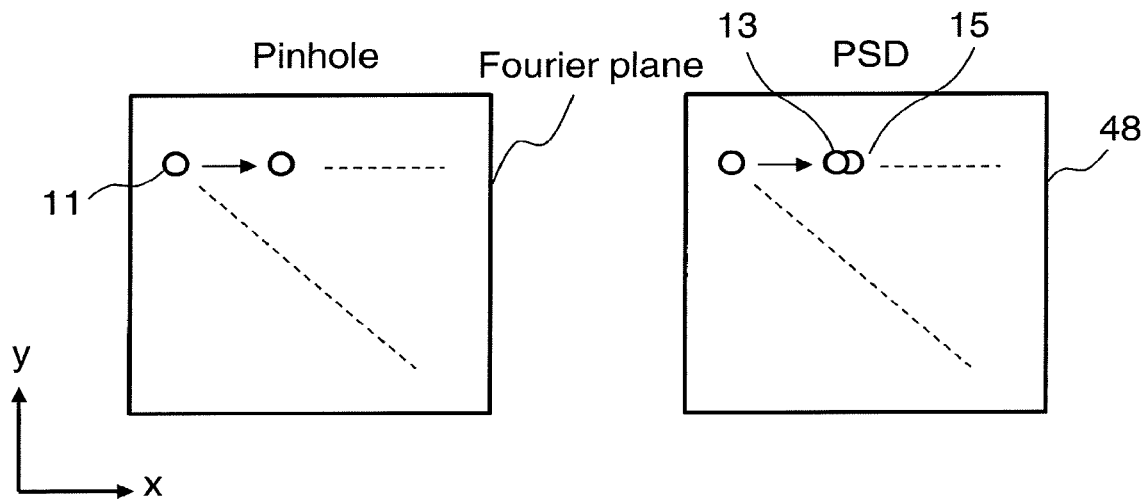
FIGS. 9A and 9B show examples of relation between a pinhole position and a measuring position of a pinhole image according to the first embodiment.

FIGS. 9A and 9B show examples of relation between a pinhole position and a measuring position of a pinhole image according to the first embodiment. FIG. 9A shows the position of the pinhole 11 at the position conjugate to the Fourier plane. The position of the pinhole 11 is shifted to each of points in a grid form in order, for example. FIG. 9B shows the measuring position of a pinhole image 13 at each position of the pinhole 11. The pinhole image at each position can be identified as being the beam at each position in the beams composing a reflected light of the displacement measuring apparatus 400. When aberration exists in the image-forming optical system 215, since the beam of the pinhole image 13 is refracted by the aberration, the pinhole image 13 is measured at the position (gravity center position G) shifted from the design position 15 according to the aberration. Since the aberration in the image-forming optical system 215 is constant (fixed), the shift amount (deviation amount) of the pinhole image at each position from the design position 15 is a constant value depending on the position. Moreover, as the pinhole substrate 14 is disposed at the position conjugate to the Fourier plane, the position of the pinhole image does not change even when the height position in the z direction of the evaluation substrate changes temporarily. Since the pinhole substrate 14 is arranged at the position conjugate to the Fourier plane, the shift amount (deviation amount) of the pinhole image at each position from the design position 15 is coincident with the deviation amount of the beam at each position in the Fourier plane at the light receiving device 214 side. Therefore, by measuring the shift amount (deviation amount) of the pinhole image at each position from the design position 15, it is possible to obtain, regardless of the height position in the z direction of the substrate 101, a shift amount (deviation amount) meaning how much the beam passing through each position concerned in the Fourier plane at the light receiving device 214 side shifts on the surface of the sensor 48.

In the beam shift map generating step (S110), the beam shift map generation unit 55 inputs a result of measurement on the sensor 48, and generates a beam shift map showing relation between each position of the pinhole 11 in the plane conjugate to the Fourier plane, (namely, each position of beam in Fourier plane), and a shift amount (deviation amount) at each position on the surface of the sensor 48.

Figure 10:
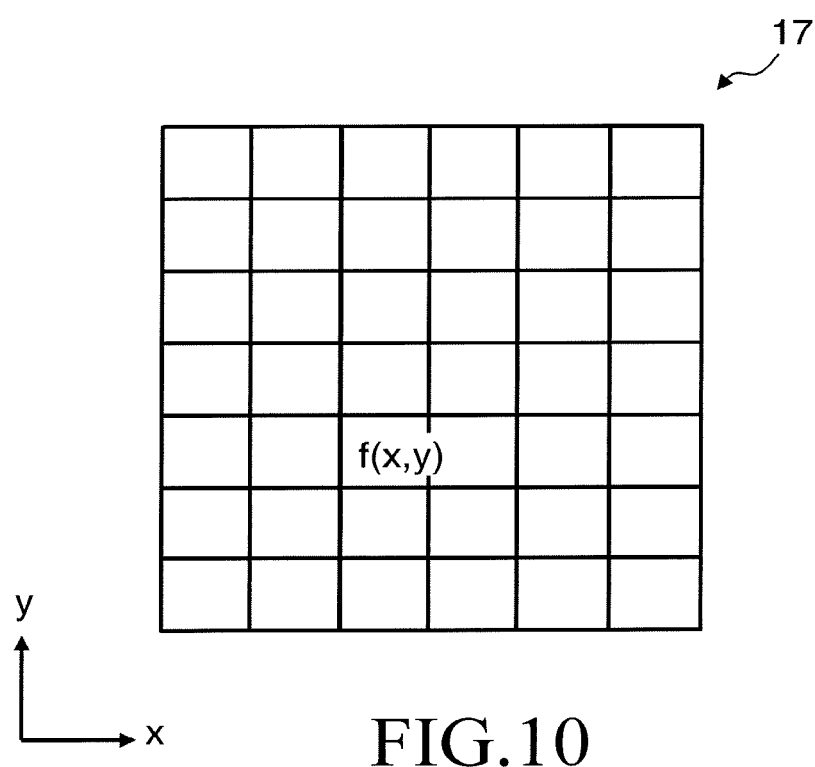
FIG. 10 shows an example of a beam shift map according to the first embodiment.

FIG. 10 shows an example of a beam shift map according to the first embodiment. The example of FIG. 10 shows, as a beam shift map 17, a two-dimensional map which is obtained by dividing the light receiving surface of the sensor 48 and the Fourier plane into a plurality of two-dimensional mesh regions in the x and y directions, and which defines for each mesh region in the Fourier plane a beam shift amount (deviation amount) $f(x, y)$, in the light receiving surface of the sensor 48, of the beam passing through the region concerned. Although the two-dimensional map is shown in the example of FIG. 10, it is not limited thereto. Since the Yheight displacement is one-dimensional direction displacement, it is sufficient to one-dimensionally measure the distance $\Delta L$ between gravity centers. Therefore, the beam shift map 17 may be generated as a one-dimensional map in accordance with the height displacement direction. The generated beam shift map 17 is stored in the storage device 54. In other words, abeam shift map defining each gravity center shift amount shifted from the design position of the pinhole image (aperture image) in the light receiving surface of the sensor 48, corresponding to each position of the pinhole image (aperture image) at the position conjugate to the Fourier plane, is stored in the storage device 54. The pattern to be inspected formed on the substrate 101 is usually different depending on each substrate. However, as long as the displacement measuring apparatus 400 of the inspection apparatus 100 is not changed, the aberration itself in the optical system does not change. Therefore, if the beam shift map 17 is generated for each inspection apparatus 100 or each displacement measuring apparatus 400, it can also be used even when the substrate 101 to be inspected is changed.

In the pinhole substrate carrying-out step (S112), the pinhole substrate 14 is carried out from on the optical axis in the projection device 212. Carrying the pinhole substrate 14 out may use the driving device (not shown), or may be performed by an artificial operation.

After performing the preprocessing described above, the substrate 101 with a pattern thereon to be used for an actual inspection is disposed on the stage 105. Then, inspection processing is now to be executed.

In the scanning (autofocusing) step (S202), the image acquisition unit 150 scans the surface of the substrate 101 with the multiple beams 20. The scanning method is what is described above. In parallel with the scanning operation, the steps from the beam gravity center measuring step (S114) to the height displacement amount calculating step (S122) to be described below are executed, and a corrected gravity center position G' of the spot of the beam irradiating the surface of the substrate 101 is measured in real time. Then, the heightwise displacement amount Δz is measured.

In the beam gravity center measuring step (S114), the displacement measuring apparatus 400 measures the gravity center position G of the beam corresponding to the height position of the substrate 101. Specifically, the illumination optical system 213 of the projection device 212 obliquely irradiates the surface of the substrate 101 on which a figure pattern is formed. Then, light emitted from the projection device 212 is reflected by the substrate 101, and the reflected light is received by the sensor 48. Based on the measured value measured by the sensor 48, the gravity center position G of the spot of the reflected light is obtained. As described above, when using, for example, a PSD sensor as the sensor 48, the gravity center position G of a beam spot on the sensor can be obtained based on the ratio of current output from the output terminals at the both ends of the light receiving region of the PSD sensor. Obtained information (measured value) on the gravity center position G of the beam spot is stored in the storage device 50.

In the light quantity distribution measuring step (S116), the camera 49 images a light diverged in the Fourier plane. The imaged data (light quantity distribution g(x, y)) is stored in the storage device 52. Light quantity received by a light-receiving element at each position (coordinates) in the camera 49 may be used as each element of the light quantity distribution g(x, y).

Figure 11:
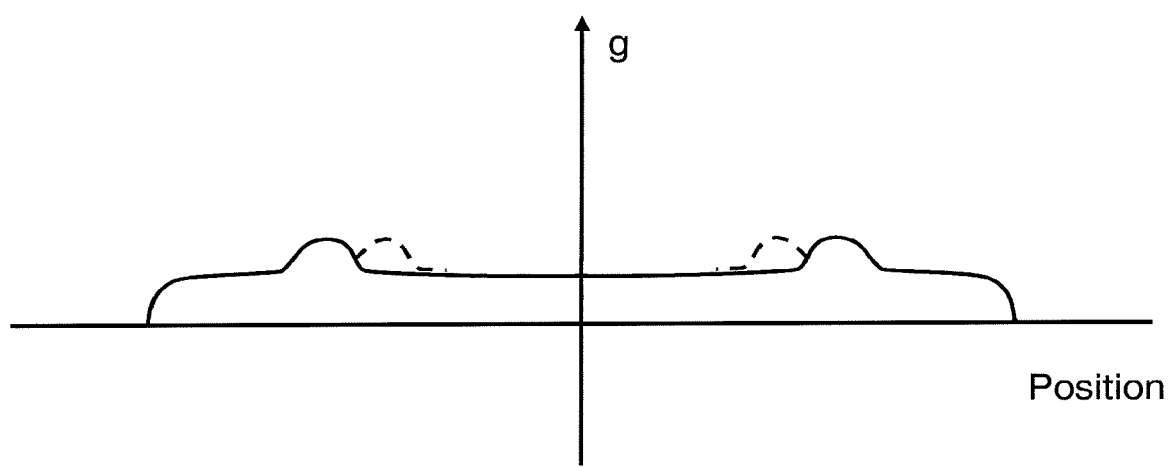
FIG. 11 shows an example of a light quantity distribution in a Fourier plane according to the first embodiment.

FIG. 11 shows an example of a light quantity distribution in a Fourier plane according to the first embodiment. The example of FIG. 11 shows a light quantity with respect to one-dimensional direction (e.g., x direction). Light quantity distribution g(x, y) of an imaged beam in the Fourier plane is different depending on a pattern formed on the substrate 101. As described above, the passage region in the Fourier plane of diffracted light (first order light) is various.

In the gravity center shift amount calculating step (S118), the gravity center shift amount calculation unit 56 calculates the gravity center shift amount ΔG of a reflected light in the light receiving surface of the sensor 48, based on the light quantity distribution g (x, y) of an imaged beam in the Fourier plane. The gravity center shift amount calculation unit 56 calculates the gravity center shift amount ΔG of the reflected light according to the light quantity distribution g(x, y) by using the beam shift map 17. Specifically, the gravity center shift amount calculation unit 56 reads the beam shift map 17 from the storage device 54, obtains the sum of values each calculated by multiplying a beam shift amount (deviation amount) f(x, y) defined for each position in the beam shift map 17 by a light quantity distribution g(x, y) of an imaged beam in the Fourier plane, and divides the obtained sum by the sum of the light quantity distribution g(x, y) at each position. The gravity center shift amount ΔG of a reflected light can be defined by the following equation (5).

$$\Delta G = \Sigma f(x,y) \cdot g(x,y) / \Sigma g(x,y) \tag{5}$$

If the light quantity distribution g(x, y) of the beam in the Fourier plane is different from each other, the obtained gravity center shift amount ΔG of the reflected light is also different from each other.

In the gravity center correcting step (S120), the gravity center correction unit 57 calculates a corrected gravity center position G' by performing correction by subtracting the gravity center shift amount ΔG according to the light quantity distribution g(x, y) of the beam imaged by the camera 49 from the gravity center position G of the beam based on a measured value measured by the sensor 48. The corrected gravity center position G' can be defined by the following equation (6).

$$G' = G - \Delta G \tag{6}$$

In the height displacement amount calculating step (S122), using information on the corrected gravity center position G' which has been obtained by correcting the gravity center position G of the reflected light received by the sensor 48 by using the gravity center shift amount ΔG, the z displacement measurement unit 58 (measurement unit) measures the heightwise displacement Δz of the surface of the substrate 101 (target object) by the optical lever method. The distance ΔL between gravity centers can be obtained by the difference (ΔL–G'–$G_0'$) between the obtained gravity center shift amount ΔG and the corrected gravity center position $G_0'$ of the beam spot on the surface of the sensor 48 measured at the heightwise position $z_0$ serving as a reference. Then, as shown in the equation (4) described above, the heightwise displacement Δz of the surface of the substrate 101 (target object) can be calculated using the distance ΔL between gravity centers.

As described above, each of the series of the beam gravity center measuring step (S114), the light quantity distribution measuring step (S116), the gravity center shift amount calculating step (S118), the gravity center correcting step (S120), and the height displacement amount calculating step (S122) is performed in parallel with the scanning (autofocusing) step (S202). However, for example, by performing, before starting scanning the substrate 101, steps from the beam gravity center measuring step (S114) to the gravity center correcting step (S120) at the heightwise position $z_0$ serving as a reference of the substrate 101, it is possible to measure the corrected gravity center position $G_0'$ of the beam spot measured at the heightwise position $z_0$ used as the reference described above.

As described above, in the first embodiment, the gravity center shift amount ΔG according to the light quantity distribution g(x, y) can be calculated using a light quantity distribution g(x, y) in the Fourier plane, and the beam shift map 17 showing a measurement error in the sensor 48 resulting from aberration of the optical system which has been previously measured. Thus, by correcting a sensor measured value by using the gravity center shift amount ΔG, it is possible to highly accurately measure a beam gravity center position (corrected gravity center position G') regardless of generation of diffracted light caused by a pattern. Therefore, it is possible to highly accurately measure a heightwise displacement Δz of the surface of the substrate 101 (target object) regardless of generation of diffracted light caused by a pattern. The heightwise displacement Δz of the surface of the substrate 101, displaced with a scanning operation and measured in real time, is output to the autofocus control circuit 142.

Figure 12:
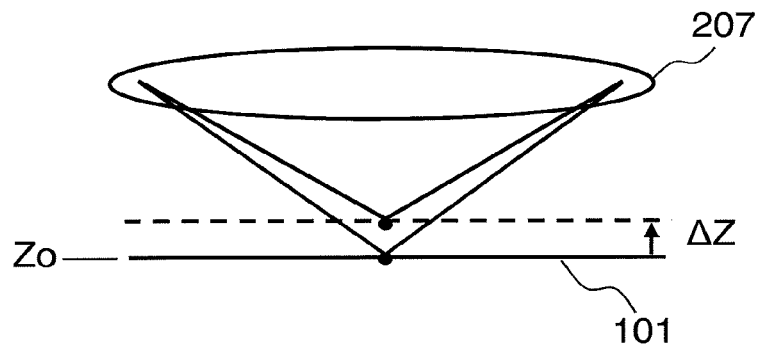
FIG. 12 illustrates an example of focus position adjustment according to the first embodiment.

FIG. 12 illustrates an example of focus position adjustment according to the first embodiment. The autofocus control circuit 142 adjusts, through the lens control circuit 124, an excitation value of the objective lens 207 by using a measured value of the heightwise displacement Δz of the surface of the substrate 101. As shown in FIG. 12, during scanning with the multiple beams 20, the objective lens 207 adjusts (autofocuses) the focus position of the multiple beams 20, based on a measured value of variable heightwise displacement Δz of the surface of the substrate 101.

Then, while adjusting the focus position of the multiple beams 20 (electron beam) by using a measured value of the heightwise displacement of the surface of the substrate 101, the image acquisition unit 150 (secondary electron acquisition unit) scans the substrate 101 with the multiple beams 20 whose focus position has been adjusted, detects a secondary electron including a reflected electron emitted from the substrate 101 due to the scanning with the multiple beams 20, and acquires a secondary electron image of a figure pattern formed on the substrate 101.

Here, the method of autofocusing is not limited to adjustment by the objective lens 207.

Figure 13:
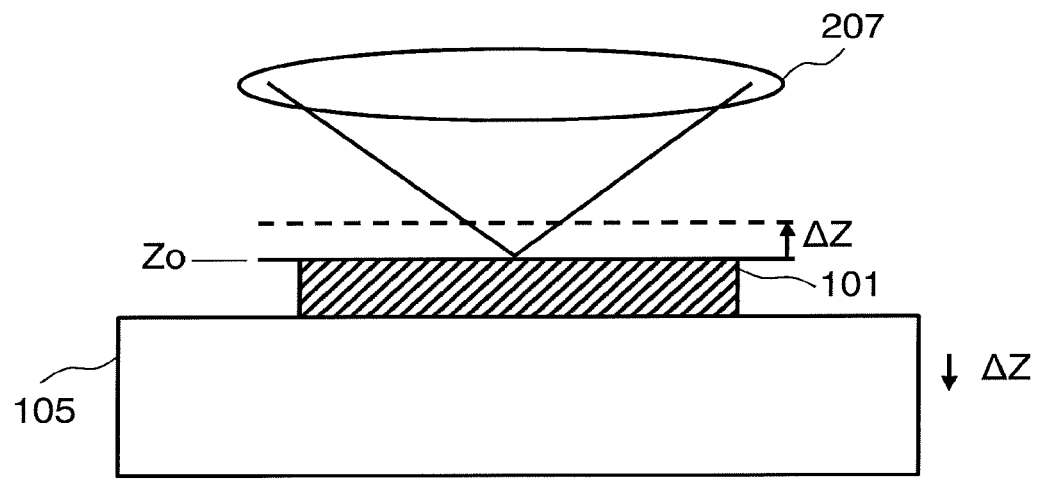
FIG. 13 illustrates another example of focus position adjustment according to the first embodiment.

FIG. 13 illustrates another example of focus position adjustment according to the first embodiment. In the example of FIG. 13, the focus position is adjusted (autofocused) using the stage 105. Specifically, the autofocus control circuit 142 adjusts, through the stage control circuit 114, a control value for controlling the height position of the stage 105, by using a measured value of the heightwise displacement $\Delta z$ of the surface of the substrate 101. The control value is output to the drive mechanism 144. During the scanning with the multiple beams 20, the drive mechanism 144 (stage drive mechanism) adjusts the focus position of the multiple beams 20 by changing the height of the stage 105 by using a measured value of variable heightwise displacement $\Delta z$ of the surface of the substrate 101.

As described above, the secondary electron image of the figure pattern which is obtained by scanning with autofocusing is transmitted to the comparison circuit 108.

In the inspection step (S206), the comparison circuit 108 inspects a secondary electron image by using a reference image. Specifically, it operates as described below.

In the case of performing a die-to-die inspection, data of measured images obtained by capturing identical patterns at different positions on the same substrate 101 are compared. Therefore, the image acquisition mechanism 150 acquires, using the multiple beams 20 (electron beams), measured images being secondary electron images, one of which corresponds to a figure pattern (first figure pattern) and the other of which corresponds to the other figure pattern (second figure pattern), from the substrate 101 on which the identical patterns (first and second figure patterns) are formed at the different positions. In that case, one of the acquired measured images of the figure patterns is treated as a reference image, and the other one is treated as an image to be inspected. The acquired images of the figure pattern (first figure pattern) and the other figure pattern (second figure pattern) may be in the same chip pattern data, or in different chip pattern data. In the first embodiment, the case of performing the die-to-die inspection will be mainly described. The structure described below can also be applied to the case of performing a die-to-database inspection.

When comparing images, images on the mask die 33, for example, are compared. In the data having been transmitted to the comparison circuit 108, first, an image (mask die image) on the mask die 33 used as an inspection image, and an image (mask die image) on the mask die 33 used as a reference image corresponding to the inspection image are position-aligned in the comparison circuit 108. Preferably, the alignment (positioning) is performed by a least-squares method, etc., for example.

Then, the inspection image and the reference image are compared for each pixel in the comparison circuit 108. Using a predetermined determination threshold, both the images are compared for each pixel, based on predetermined determination conditions in order to determine whether there is a defect such as a shape defect. For example, if a gray scale value difference for each pixel is larger than a determination threshold Th, it is determined that a defect exists. Then, the comparison result is output, and specifically, output to the storage device 109, monitor 117, or memory 118, or alternatively, output from the printer 119.

Alternatively, contour of a figure pattern in each of the inspection image and the reference image is generated. Then, deviation between contours of figure patterns to be matched is compared. For example, if deviation between the contours is larger than the determination threshold Th', it is determined that a defect exists. The comparison result is output, and specifically, output to the storage device 109, monitor 117, or memory 118, or alternatively, output from the printer 119.

The case of performing die-to-die inspection has been described in the above examples. Besides, what has been described can be applied to the case of die-to-database inspection. In such a case, the reference image generating circuit 112 generates, for each mask die, a reference image based on design pattern data serving as a basis for forming a pattern on the substrate 101, or exposure image data of a pattern formed on the substrate 101. Specifically, it operates as described below. First, design pattern data (exposure image data) is read from the storage device 109 through the control computer 110, and each figure pattern defined in the read design pattern data is converted into image data of binary or multiple values.

Here, basics of figures defined by design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data, used as figure data, is input to the reference image generation circuit 112, the data is developed into data of each figure. Then, the figure code, the figure dimensions and the like indicating the figure shape in the data of each figure are interpreted. Then, the reference image generation circuit 112 develops each figure data to design pattern image data of binary or multiple values as a pattern to be arranged in a mesh region in units of grids of predetermined quantization dimensions, and outputs the developed data. In other words, the reference image generation circuit 112 reads design data, calculates an occupancy rate occupied by a figure in the design pattern, for each mesh region obtained by virtually dividing an inspection region into grid squares in units of predetermined dimensions, and outputs n-bit occupancy rate data. For example, it is preferable that one mesh region is set as one pixel. Assuming that one pixel has a resolution of $\frac{1}{2}^8$ (=$\frac{1}{256}$), the occupancy rate in each pixel is calculated by allocating small regions which correspond to the region of figures arranged in the pixel concerned and each of which is corresponding to a $\frac{1}{256}$ resolution. Then, 8-bit occupancy rate data is output to the reference circuit 112. The mesh region (inspection pixel) can be in accordance with the pixel of measured data.

Next, the reference image generation circuit 112 performs appropriate filter processing on design image data of a design pattern which is image data of a figure. Since optical image data as a measured image is in the state affected by filtering performed by the optical system, in other words, in the analog state continuously changing, it is possible to match/fit the design image data with the measured data by also applying a filtering process to the design image data being image data on the design side whose image intensity (gray value) is represented by digital values.

When exposure image data has been stored as gray scale data for each pixel, target exposure image data of the mask die can be used as a reference image. If the exposure image data is figure data defining the shape, size, position, and the like of each pattern figure by using information, such as coordinates (x, y), side lengths, and figure codes, a reference image can be generated by the same method as that for design pattern data described above. Image data of the generated reference image is output to the comparison circuit 108. The contents of processing performed in the comparison circuit 108 may be the same as those of the die-to-die inspection described above.

Thus, according to the first embodiment, it is possible to correct measurement error of height displacement when measuring height displacement of the substrate with patterns formed thereon.

In the above description, each " . . . circuit" includes a processing circuitry. As the processing circuitry, for example, an electric circuit, computer, processor, circuit board, quantum circuit, semiconductor device, or the like can be used. Each " . . . circuit" may use a common processing circuitry (same processing circuitry), or different processing circuitries (separate processing circuitries). A program for causing a processor to execute processing may be stored in a recording medium, such as a magnetic disk drive, magnetic tape drive, FD, ROM (Read Only Memory), etc. For example, the position circuit 107, the comparison circuit 108, the reference image generation circuit 112, the height displacement measuring circuit 140, the autofocus control circuit 142, etc. may be configured by at least one processing circuitry described above.

Embodiments have been explained referring to specific examples described above. However, the present invention is not limited to these specific examples. Although, in the embodiments described above, the inspection apparatus using electron multiple beams has been explained as an inspection apparatus provided with a displacement measuring apparatus, it is not limited thereto. The displacement measuring apparatus of the embodiments described above can also be applied to other type inspection apparatus. Moreover, it can also be applied to other apparatus, other than the inspection apparatus. Alternatively, it may be used alone. In any event, the displacement measuring apparatus of the embodiments described above is applicable as long as it uses the optical lever method of measuring heightwise displacement of a target object by irradiating from an oblique direction the surface of the target object with patterns formed thereon by a beam, and receiving a reflected light from the surface of the target object.

Although, in the embodiments described above, each of the beam gravity center measuring step (S114), the light quantity distribution measuring step (S116), the gravity center shift amount calculating step (S118), the gravity center correcting step (S120), and the height displacement amount calculating step (S122) is performed in parallel with the scanning (autofocusing) step (S202), it is not limited thereto. For example, before performing the scanning (autofocusing) step (S202), the amount of height displacement of the substrate 101 may be previously measured while moving the stage 105. When performing the scanning (autofocusing) step (S202), it is also preferable to execute autofocusing using the amount of height displacement of the substrate 101 which has been measured in advance.

While the apparatus configuration, control method, and the like not directly necessary for explaining the present invention are not described, some or all of them can be selectively used on a case-by-case basis when needed.

In addition, any other displacement measuring apparatus and electron beam inspection apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A displacement measuring apparatus comprising:
   an illumination optical system configured to irradiate, from an oblique direction, a surface of a target object with a beam;
   a sensor configured to receive a reflected light from the surface of the target object irradiated with the beam;
   an optical system configured to diverge the reflected light in a Fourier plane with respect to the surface of the target object;
   a camera configured to image a diverged beam in the Fourier plane;
   a gravity center shift amount calculation circuitry configured to calculate a gravity center shift amount of the reflected light in a light receiving surface of the sensor, based on a light quantity distribution of the beam imaged by the camera;
   a measurement circuitry configured to measure a heightwise displacement of the surface of the target object by an optical lever method, using information on a corrected gravity center position which is obtained by correcting a gravity center position of the reflected light received by the sensor by using the gravity center shift amount; and
   a storage device configured to store a beam shift map defining a gravity center shift amount shifted from a design position of an aperture image in the light receiving surface of the sensor, corresponding to each position of the aperture image at a position conjugate to the Fourier plane, wherein
   the gravity center shift amount calculation circuitry calculates the gravity center shift amount of the reflected light, based on the light quantity distribution, using the beam shift map.

2. The apparatus according to claim 1, the optical system includes a half mirror arranged in the Fourier plane with respect to the surface of the target object.

3. The apparatus according to claim 1, further comprising:
   a pinhole substrate with a pinhole formed therein, disposed at a position conjugate to the Fourier plane and configured to be carried in and carried out.

4. The apparatus according to claim 3, wherein the illumination optical system irradiates from the oblique direction the surface of the target object with the beam of a pinhole image having passed through the pinhole.

5. The apparatus according to claim 1, further comprising:
   a gravity center correction circuitry configured to calculate the corrected gravity center position by correcting the gravity center position of the reflected light received by the sensor.

6. An electron beam inspection apparatus comprising:
   an illumination optical system configured to irradiate, with a beam, from an oblique direction a surface of a target object with a figure pattern formed thereon;

a sensor configured to receive a reflected light from the surface of the target object irradiated with the beam;

an optical system configured to diverge the reflected light in a Fourier plane with respect to the surface of the target object;

a camera configured to image a diverged beam in the Fourier plane;

a gravity center shift amount calculation circuitry configured to calculate a gravity center shift amount of the reflected light in a light receiving surface of the sensor, based on a light quantity distribution of the beam imaged by the camera;

a measurement circuitry configured to measure a heightwise displacement of the surface of the target object by an optical lever method, using information on a corrected gravity center position which is obtained by correcting a gravity center position of the reflected light received by the sensor by using the gravity center shift amount;

a secondary electron image acquisition mechanism configured to acquire a secondary electron image of the figure pattern by scanning the surface of the target object with an electron beam while adjusting a focus position of the electron beam based on a measured value of heightwise displacement of the surface of the target object, and by detecting a secondary electron including a reflected electron emitted from the target object due to the scanning with the electron beam;

a comparison circuitry configured to compare, using a reference image, the secondary electron image with the reference image; and a storage device configured to store a beam shift map defining a gravity center shift amount shifted from a design position of an aperture image in the light receiving surface of the sensor, corresponding to each position of the aperture image at a position conjugate to the Fourier plane, wherein the gravity center shift amount calculation circuitry calculates the gravity center shift amount of the reflected light, based on the light quantity distribution, using the beam shift map.

7. The apparatus according to claim 6, wherein
the secondary electron image acquisition mechanism includes an objective lens to focus the electron beam on the surface of the target object, and
the objective lens adjusts, during the scanning with the electron beam, the focus position of the electron beam, based on the measured value of variable heightwise displacement of the surface of the target object.

8. The apparatus according to claim 6, wherein
the secondary electron image acquisition mechanism includes a stage on which the target object is placed, and a stage drive mechanism to drive the stage, and
the stage drive mechanism adjusts, during the scanning with the electron beam, the focus position of the electron beam by changing a height of the stage by using the measured value of variable heightwise displacement of the surface of the target object.

9. A displacement measuring method comprising:
receiving, by a sensor, a reflected light from a surface of a target object, due to that the surface of the target object is irradiated from an oblique direction with a beam;
imaging, by a camera, a diverged beam in a Fourier plane with respect to the surface of the target object;
calculating a gravity center shift amount of the reflected light in a light receiving surface of the sensor, based on a light quantity distribution of the beam imaged by the camera;
measuring a heightwise displacement of the surface of the target object by an optical lever method, using information on a corrected gravity center position which is obtained by correcting a gravity center position of the reflected light received by the sensor by using the gravity center shift amount, and outputting a measured result; and
storing a beam shift map defining a gravity center shift amount shifted from a design position of an aperture image in the light receiving surface of the sensor, corresponding to each position of the aperture image at a position conjugate to the Fourier plane, to a storage device, wherein
the gravity center shift amount of the reflected light is calculated, based on the light quantity distribution, using the beam shift map.

* * * * *